(12) United States Patent
Nikitin et al.

(10) Patent No.: US 9,690,757 B2
(45) Date of Patent: Jun. 27, 2017

(54) METHOD OF AND SYSTEM FOR PROCESSING CONTENT OF A WEB RESOURCE IN A BROWSER APPLICATION

(71) Applicant: YANDEX EUROPE AG, Lucerne (CH)

(72) Inventors: Konstantin Sergeevitch Nikitin, Kaluga Region (RU); Vyacheslav Olegovich Chigrin, Kharkov (RU)

(73) Assignee: YANDEX EUROPE AG, Lucerne (CH)

(*) Notice: Subject to any disclaimer, the term of this patent is extended or adjusted under 35 U.S.C. 154(b) by 0 days.

(21) Appl. No.: 15/102,761

(22) PCT Filed: Dec. 10, 2014

(86) PCT No.: PCT/IB2014/066770
§ 371 (c)(1),
(2) Date: Jun. 8, 2016

(87) PCT Pub. No.: WO2016/051241
PCT Pub. Date: Apr. 7, 2016

(65) Prior Publication Data
US 2017/0031871 A1    Feb. 2, 2017

(30) Foreign Application Priority Data

Sep. 29, 2014 (RU) ................ 2014139172

(51) Int. Cl.
*G06F 3/00* (2006.01)
*G06F 9/44* (2006.01)
(Continued)

(52) U.S. Cl.
CPC .......... *G06F 17/2205* (2013.01); *G06F 3/065* (2013.01); *G06F 3/067* (2013.01);
(Continued)

(58) Field of Classification Search
None
See application file for complete search history.

(56) References Cited

U.S. PATENT DOCUMENTS 8,341,519 B1  12/2012 Warr et al.
2012/0030317 A1  2/2012 Smyth et al.
(Continued)

FOREIGN PATENT DOCUMENTS

| KR | 20130017620 A | 2/2013 |
|---|---|---|
| RU | 2432608 C2 | 10/2011 |
| WO | 2014031141 A1 | 2/2014 |

OTHER PUBLICATIONS

International Search Report from PCT/IB2014/066770, Apr. 28, 2015, Lee W. Young.
(Continued)

*Primary Examiner* — Craig Dorais
(74) *Attorney, Agent, or Firm* — BCF LLP

(57) ABSTRACT

There is disclosed a method of storing content of a web page, web page having a static object and a dynamic object, the web page being displayed in a browser application executed on an electronic device, the electronic device having a memory. The method can be executed by the electronic device. The method comprises: storing, in an archive file, an indication of the static object; storing, in the archive file, an indication of the dynamic object; identifying at least one binding between the dynamic object to the static object, the binding being representative of a link therebetween; storing an indication of the binding in the archive file; storing the archive file in the memory.

13 Claims, 7 Drawing Sheets

(51) Int. Cl.
*G06F 9/46* (2006.01)
*G06F 13/00* (2006.01)
*G06F 17/22* (2006.01)
*H04L 29/08* (2006.01)
*G11C 7/10* (2006.01)
*G06F 3/06* (2006.01)
*G06F 3/0483* (2013.01)

(52) U.S. Cl.
CPC ........ *G06F 3/0619* (2013.01); *G06F 17/2247* (2013.01); *G11C 7/1072* (2013.01); *H04L 67/02* (2013.01); *G06F 3/0483* (2013.01)

(56) References Cited

U.S. PATENT DOCUMENTS

| | | |
|---|---|---|
| 2012/0066586 A1 | 3/2012 | Shemesh |
| 2012/0331406 A1 | 12/2012 | Baird et al. |
| 2013/0047064 A1 | 2/2013 | Leithead et al. |
| 2013/0136253 A1 | 5/2013 | Liberman Ben-Ami et al. |
| 2014/0215013 A1 | 7/2014 | Subramanian et al. |

OTHER PUBLICATIONS

International Preliminary Report on Patentability from PCT/IB2014/066770, Dec. 11, 2015, Quang N. Nguyen.

English abstract of KR20130017620 retrieved from Espacenet on Jun. 7, 2016.

FIG. 2 (PRIOR ART)

TABLE 1: HTML code for an illustrative one of the web page 404.

```
1   <html>
2   <head>
3
4   <script language="javascript">
5     var my_element;
6     var my_style;
7
8     function getReferences() {
9       my_element = document.getElementById('test-div');
10      my_style = my_element.style;
11    }
12    //.....
13    </script>
14
15    </head>
16    <body onload="getReferences()">
17      <div id="test-div" style="color:red">Something</div>
18    </body>
19  </html>
```

TABLE 2: MHTML archive content.

```
1   <html>
2   <head>
3
4   <script language="javascript">
5     var my_element;
6     var my_style;
7
8     function getReferences() {
9       my_element = document.getElementById('test-div');
10      my_style = my_element.style;
11    }
12    //.....
13    </script>
14
15    </head>
16    <body onload="getReferences()">
17      <div id="test-div" style="color:red" hibernate-info-id="2000">Something</div>
18    </body>
19  </html>
```

FIGURE 7

METHOD OF AND SYSTEM FOR PROCESSING CONTENT OF A WEB RESOURCE IN A BROWSER APPLICATION

CROSS-REFERENCE

The present application claims convention priority to Russian Patent Application No. 2014121800, filed May 29, 2014, entitled "METHOD OF AND SYSTEM FOR PROCESSING CONTENT OF A WEB RESOURCE IN A BROWSER APPLICATION" which is incorporated by reference herein in its entirety.

FIELD

The present technology relates to web browsers in general and specifically to a method of and a system for processing content of a web resource in a browser application.

BACKGROUND

Various global or local communication networks (the Internet, the World Wide Web, local area networks and the like) offer a user a vast amount of information. The information includes a multitude of contextual topics, such as but not limited to, news and current affairs, maps, company information, financial information and resources, traffic information, games and entertainment related information. Users use a variety of client devices (desktop, laptop, notebook, smartphone, tablets and the like) to gain access to rich content (like images, audio, video, animation, and other multimedia content from such networks).

In order to access a web resource, a user typically utilizes a browser application. With reference to FIG. 1, a screen shot 102 depicts a browser application 104 generally implemented according to the known state of the art. The browser application 104 can be executed on most known electronic devices (laptops, desktops, smartphones, pads and the like). The depicted screen shot 102 illustrated the browser application 104, which browser application 104 is implemented as a Mozilla Firefox browser. However, those in the art will appreciate numerous other known types of browser applications 104, such as a Google™ Chrome™, a Yandex™ browser, as well as a number of additional commercial or proprietary browsers.

Irrespective of how the browser application 104 is implemented, the browser application 104, typically, has a command interface 106 and a browsing interface 108. Generally speaking, a given user can access a resource on the communication network by two principle means. The given user can access a particular resource directly, either by typing an address of the resource (typically an URL or Universal Resource Locator) into the command interface 106 or by clicking a link in an e-mail or in another web resource (which action will in a sense "copy and paste" the URL associated with the link into the command interface 106).

Alternatively, the given user may conduct a search using a search engine to locate a resource of interest. The latter is particularly suitable in those circumstances, where the given user knows a topic of interest, but does not know the exact address of the resource she is interested in. The search engine typically returns a Search Engine Results Page (SERP) containing links to one or more web resources that are responsive to the user query. Again, upon user clicking one or more links provided within the SERP, the user can open the required web resource.

Hence, the purpose of the command interface 106 is to allow the user to type or copy-and-paste a Unified Resource Locator (URL) or, simply, an address associated with the web resource the user is looking for. The purpose of the browsing interface 108 is to show the web resource that is hosted at the address, which URL is entered into the command interface 106.

Within the modern browser applications 104, the command interface 106 is typically implemented as an "omnibox" field—the one incorporating functionality of the field for entering URLs and the field for entering search queries for the search engine associated with the browser application 104 to search. In other words, within such prior art implementations, the user can use the command interface 106 for both entering search queries and URLs. The browsing interface 108 is, therefore, can be for displaying to the user either (i) a web resource associated with the URL entered into the command interface 106 or (ii) a search results page (SERP) generated in response to the search query entered in the command interface 106.

Now, as a brief description of the browser application 104, the browser application 104 includes a browser command buttons panel 112, the browser command buttons panel 112 including a number of conventionally known fields, such as "File", "Edit", "View", "History", "Bookmarks", "Tools", "Help". The browser application 104 includes a browser control buttons panel 111, which browser control buttons panel 111 includes the well-known button for minimizing the browser screen, maximizing the browser screen and closing the browser screen (all not numbered).

The browser application 104 also includes a conventionally-known back button 116, the back button 116 for allowing the user to go back to one or more of the previously viewed web resources. The browser application 104 also includes a forward button 118 (greyed out) for going "forward" after the back button 116 has been potentially used. The browser application 104 contains a number of additional buttons 120, such as a reload button, a close button and a "home" button (all not numbered) conventionally known to those of skill in the art.

There is also provided an area 122 for one or more tabs of the browsed pages. It is typical for the user to multi-task when browsing the various web resources using the browser application 104. For example, a given user may have multiple web resources "opened" at the same time. This may be the case when the user is simultaneously "browsing" several resources. This may also happen when the user has browsed one or more resources and decided to "keep" it in the browser application 104 to refer to them later.

To address this situation, the user may open several instances of the browser application 104, each instance showing therein a different web resource (so-called, browsing by window). Alternatively, the user may open several "tabs" in a single instance of the browser application 104, each tab showing therein a different web resource (so-called, browsing by tabs). The graphical indication of each opened tab will appear in the area 122. The user can then switch between the various opened web resources by either selecting an appropriate window (i.e. instance of the browser application 104) or by selecting an appropriate tab within the single instance of the browser application 104. Needless to say, the two methods can be mixed and matched by the given user in a single browsing session.

With reference to FIG. 2, there is depicted a screen shot 200, the screen shot 200 depicting the browser application 104 with fifteen instances of tabs 202 opened therein. The fifteen instances of tabs 202 are representative of the fifteen web resources currently being browsed by the user. Within the depicted illustration, fourteen out of the fifteen web resources currently being browsed are the various articles on the Wikipedia web resource, each of the articles being associated with a dedicated one of the fifteen instances of tabs 202.

SUMMARY

It is an object of the present technology to ameliorate at least some of the inconveniences present in the prior art.

Embodiments of the present technology have been developed based on inventors' appreciation of at least one problem associated with the prior art solution. Referring to the screen shot 200 of FIG. 2 (as a representation of the prior art approaches), one of the problems associated with the prior art approaches is the potentially over-burden on the processing power associated with the electronic device that executes the browser application 104. This over-burden may result from using processing power to maintain the content of each of the fifteen instances of tabs 202 in the background. Moreover, some of the content of the fifteen instances of tabs 202 may be dynamic and may require ongoing updates from the associated source of content, again adding to the burden on the processing resources, as well as communication bandwidth.

According to a first broad aspect of the present technology, there is provided a method of storing content of a web page, web page having a static object and a dynamic object. The web page is displayed in a browser application executed on an electronic device, the electronic device having a memory. The method is being executed by the electronic device. The method comprises: storing, in an archive file, an indication of the static object; storing, in the archive file, an indication of the dynamic object; identifying at least one binding between the dynamic object to the static object, the binding being representative of a link therebetween; storing an indication of the binding in the archive file; storing the archive file in the memory.

In some implementations of the method, the archive file comprises an MHTML file.

In some implementations of the method, the step of storing the indication of the static object comprises storing a DOM tree element in the MHTML file.

In some implementations of the method, the step of storing the indication of the dynamic object comprises serializing a JavaScrip heap and storing an indication thereof in the MHTML file.

In some implementations of the method, the step of storing an indication of the binding comprises maintaining a reference tracker, the reference tracker for mapping the static object to an associated hibernate-ID, hibernate-ID being representative of the binding.

In some implementations of the method, the step of storing an indication of the binding further comprises maintaining an element information table mapping an identifier of the static object and the associated hibernate-id, the mapping having a unique record identifier.

In some implementations of the method, the static object comprises an associated object, and wherein the dynamic object comprises a respective binding to the static object and the associated object, and wherein the element information mapping maintains a respective hibernate-ID identifier for the static object and the associated object in association with the unique record identifier.

In some implementations of the method, the step of storing the indication of the static object comprises storing a DOM tree element in the MHTML file, the method further comprising augmenting a record associated with the DOM tree element in the MHTML file with an indication of the unique record identifier.

In some implementations of the method, the method further comprises augmenting a record associated with the dynamic object in the JavaScrip heap with an indication of the hibernate-ID of the static object.

In some implementations of the method, the step of storing the indication of the static object comprises storing a DOM tree element in the MHTML file; the step of storing the indication of the dynamic object comprises serializing a JavaScrip heap and storing an indication thereof in the MHTML file; the step of storing the indication of the binding comprises: maintaining a reference tracker, mapping the static object to an associated hibernate-ID and maintaining an element information table mapping an identifier of the static object and the associated hibernate-id, the mapping having a unique record identifier; augmenting a record associated with the DOM tree element in the MHTML file with an indication of the unique record identifier; augmenting a record associated with the dynamic object in the JavaScrip heap with an indication of the hibernate-ID of the static object.

In some implementations of the method, the static object comprises an associated object, and wherein the dynamic object comprises a respective binding to the static object and the associated object, and wherein the element information mapping maintains a respective hibernate-ID identifier for the static object and the associated object in association with the unique record identifier.

In some implementations of the method, the method further comprises restoring the archive file.

In some implementations of the method, the step of the step of restoring comprises: retrieving the static object from the DOM tree element in the MHTML file; retrieving the dynamic object from the JavaScrip heap stored in the MHTML file; retrieving the binding from the MHTML file.

In some implementations of the method, the step of retrieving the binding from the MHTML file comprises: responsive to the record associated with the DOM tree element in the MHTML file containing the indication of the unique record identifier, accessing the element information table to retrieve the associated hibernate-id; re-registering the hibernate-ID and the associated object identifier in the reference tracker; responsive to detection of the indication of the hibernate-ID in the record associated with the dynamic object in the JavaScript heap, accessing the reference tracker to retrieve the associated object identifier; based on the associated object identifier, restoring the binding.

In some implementations of the method, the method is executed as part of tab hibernating routine, the hibernation routine being associated with a tab in the browser application associated with the web page.

In some implementations of the method, the tab hibernating routine is executed in response to detection of user inactivity in association with the tab.

In some implementations of the method, the method further comprises executing a restoration routine.

In some implementations of the method, the restoration routine is executed in response to a user re-activating the tab.

In some implementations of the method, the memory comprises a random access memory and a hard drive memory, and wherein the static object and the dynamic object are stored in the random access memory prior to the execution of the method and in the hard drive memory after execution of the method.

In accordance with another broad aspect of the present technology, there is provided a server. The server comprises: a communication interface for communication with an electronic device via a communication network, a memory; a processor operationally connected with the communication interface and the memory, the processor configured to store content of a web page, web page having a static object and a dynamic object, the web page being displayed in a browser application executed by the processor, the processor being further configured to: store, in an archive file, an indication of the static object; store, in the archive file, an indication of the dynamic object; identify at least one binding between the dynamic object to the static object, the binding being representative of a link therebetween; store an indication of the binding in the archive file; store the archive file in the memory.

In some implementations of the server, the archive file comprises an MHTML file.

In some implementations of the server, to store the indication of the static object, the processor is configured to store a DOM tree element in the MHTML file.

In some implementations of the server, to store the indication of the dynamic object the processor is configured to serialize a JavaScrip heap and storing an indication thereof in the MHTML file.

In some implementations of the server, to store an indication of the binding the processor is configured to maintain a reference tracker, the reference tracker for mapping the static object to an associated hibernate-ID, hibernate-ID being representative of the binding.

In some implementations of the server, to store an indication of the binding the processor is configured to maintain an element information table mapping an identifier of the static object and the associated hibernate-id, the mapping having a unique record identifier.

In some implementations of the server, the static object comprises an associated object, and wherein the dynamic object comprises a respective binding to the static object and the associated object, and wherein the element information mapping maintains a respective hibernate-ID identifier for the static object and the associated object in association with the unique record identifier.

In some implementations of the server, to store the indication of the static object the processor is configured to store a DOM tree element in the MHTML file, the method further comprising augmenting a record associated with the DOM tree element in the MHTML file with an indication of the unique record identifier.

In some implementations of the server, the processor is further configured to augment a record associated with the dynamic object in the JavaScrip heap with an indication of the hibernate-ID of the static object.

In some implementations of the server, to store the indication of the static object comprises, the processor is configured to store a DOM tree element in the MHTML file; to store the indication of the dynamic object the processor is configured to serialize a JavaScrip heap and storing an indication thereof in the MHTML file; to store the indication of the binding the processor is configured to: maintain a reference tracker, mapping the static object to an associated hibernate-ID and maintain an element information table mapping an identifier of the static object and the associated hibernate-id, the mapping having a unique record identifier; augment a record associated with the DOM tree element in the MHTML file with an indication of the unique record identifier; augment a record associated with the dynamic object in the JavaScrip heap with an indication of the hibernate-ID of the static object.

In some implementations of the server, the static object comprises an associated object, and wherein the dynamic object comprises a respective binding to the static object and the associated object, and wherein the element information mapping maintains a respective hibernate-ID identifier for the static object and the associated object in association with the unique record identifier.

In some implementations of the server, the processor is further operable to restore the archive file.

In some implementations of the server, to restore the processor is configured to: retrieve the static object from the DOM tree element in the MHTML file; retrieve the dynamic object from the JavaScrip heap stored in the MHTML file; retrieve the binding from the MHTML file.

In some implementations of the server, to retrieve the binding from the MHTML file the processor is configured: responsive to the record associated with the DOM tree element in the MHTML file containing the indication of the unique record identifier, to access the element information table to retrieve the associated hibernate-id; to re-register the hibernate-ID and the associated object identifier in the reference tracker; responsive to detection of the indication of the hibernate-ID in the record associated with the dynamic object in the JavaScript heap, to access the reference tracker to retrieve the associated object identifier; based on the associated object identifier, restore the binding.

In some implementations of the server, the memory comprises a random access memory and a hard drive memory, and wherein the static object and the dynamic object are stored in the random access memory prior to the execution of the method and in the hard drive memory after execution of the method.

In the context of the present specification, a "server" is a computer program that is running on appropriate hardware and is capable of receiving requests (e.g. from client devices) over a network, and carrying out those requests, or causing those requests to be carried out. The hardware may be one physical computer or one physical computer system, but neither is required to be the case with respect to the present technology. In the present context, the use of the expression a "server" is not intended to mean that every task (e.g. received instructions or requests) or any particular task will have been received, carried out, or caused to be carried out, by the same server (i.e. the same software and/or hardware); it is intended to mean that any number of software elements or hardware devices may be involved in receiving/sending, carrying out or causing to be carried out any task or request, or the consequences of any task or request; and all of this software and hardware may be one server or multiple servers, both of which are included within the expression "at least one server".

In the context of the present specification, "client device" is any computer hardware that is capable of running software appropriate to the relevant task at hand. Thus, some (non-limiting) examples of client devices include personal computers (desktops, laptops, netbooks, etc.), smartphones, and tablets, as well as network equipment such as routers, switches, and gateways. It should be noted that a device acting as a client device in the present context is not precluded from acting as a server to other client devices. The use of the expression "a client device" does not preclude multiple client devices being used in receiving/sending, carrying out or causing to be carried out any task or request, or the consequences of any task or request, or steps of any method described herein.

In the context of the present specification, a "database" is any structured collection of data, irrespective of its particular structure, the database management software, or the computer hardware on which the data is stored, implemented or otherwise rendered available for use. A database may reside on the same hardware as the process that stores or makes use of the information stored in the database or it may reside on separate hardware, such as a dedicated server or plurality of servers.

In the context of the present specification, the expression "information" includes information of any nature or kind whatsoever capable of being stored in a database. Thus information includes, but is not limited to audiovisual works (images, movies, sound records, presentations etc.), data (location data, numerical data, etc.), text (opinions, comments, questions, messages, etc.), documents, spreadsheets, etc.

In the context of the present specification, the expression "component" is meant to include software (appropriate to a particular hardware context) that is both necessary and sufficient to achieve the specific function(s) being referenced.

In the context of the present specification, the expression "computer usable information storage medium" is intended to include media of any nature and kind whatsoever, including RAM, ROM, disks (CD-ROMs, DVDs, floppy disks, hard drivers, etc.), USB keys, solid state-drives, tape drives, etc.

In the context of the present specification, the words "first", "second", "third", etc. have been used as adjectives only for the purpose of allowing for distinction between the nouns that they modify from one another, and not for the purpose of describing any particular relationship between those nouns. Thus, for example, it should be understood that, the use of the terms "first server" and "third server" is not intended to imply any particular order, type, chronology, hierarchy or ranking (for example) of/between the server, nor is their use (by itself) intended imply that any "second server" must necessarily exist in any given situation. Further, as is discussed herein in other contexts, reference to a "first" element and a "second" element does not preclude the two elements from being the same actual real-world element. Thus, for example, in some instances, a "first" server and a "second" server may be the same software and/or hardware, in other cases they may be different software and/or hardware.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 2 depicts a screen shot 200, the screen shot 200 showing the browser application 104 with fifteen instances of tabs 202 opened therein implemented in accordance with the prior art techniques.

FIG. 7 depicts Table 1 and Table 2, each of which illustrates sample code used with non-limiting embodiments of the present technology.

DETAILED DESCRIPTION

Figure 1:
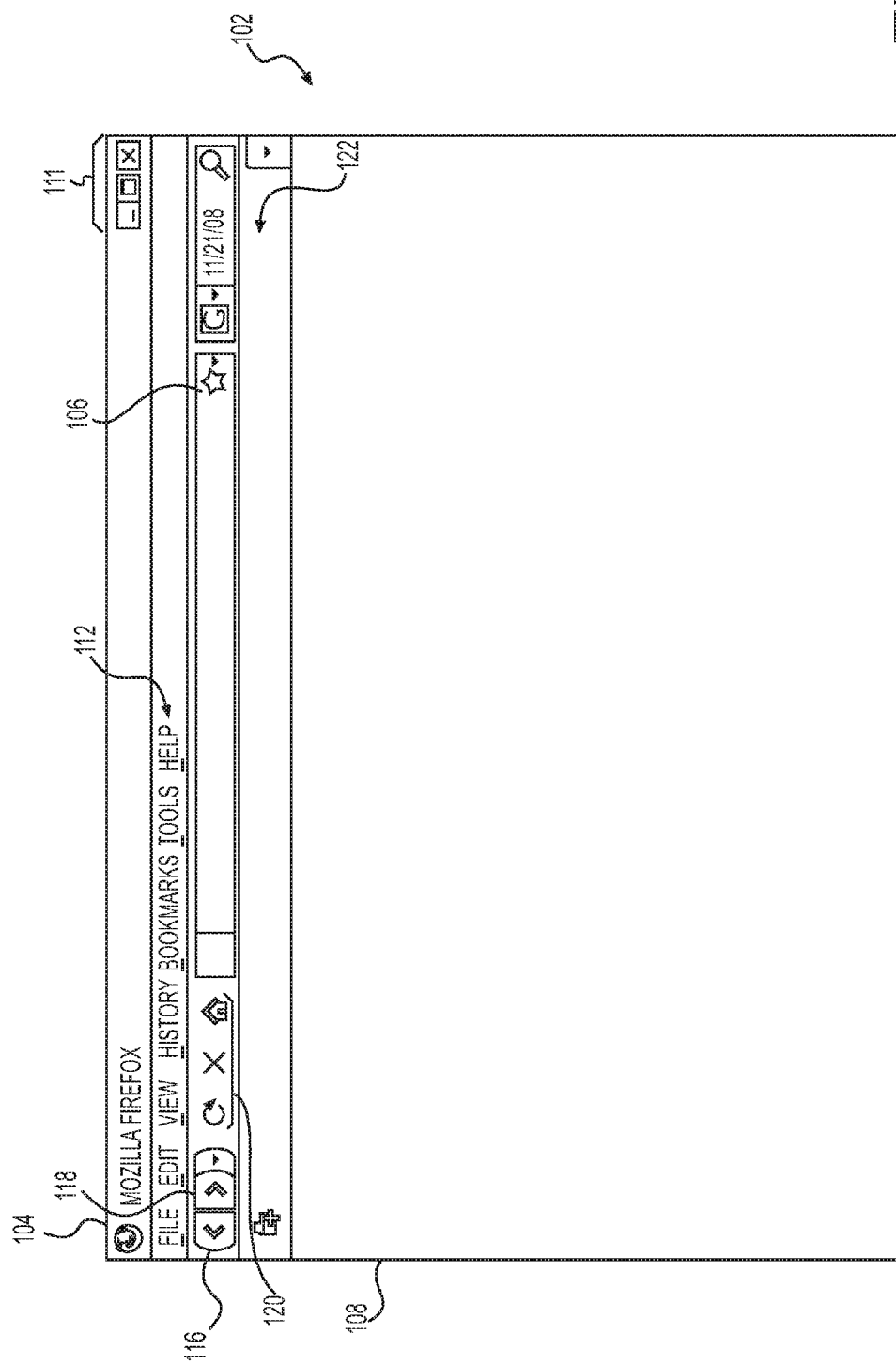
FIG. 1 depicts a screen shot 102 which shows a browser application 104 generally implemented according to the known state of the art.
Figure 3:
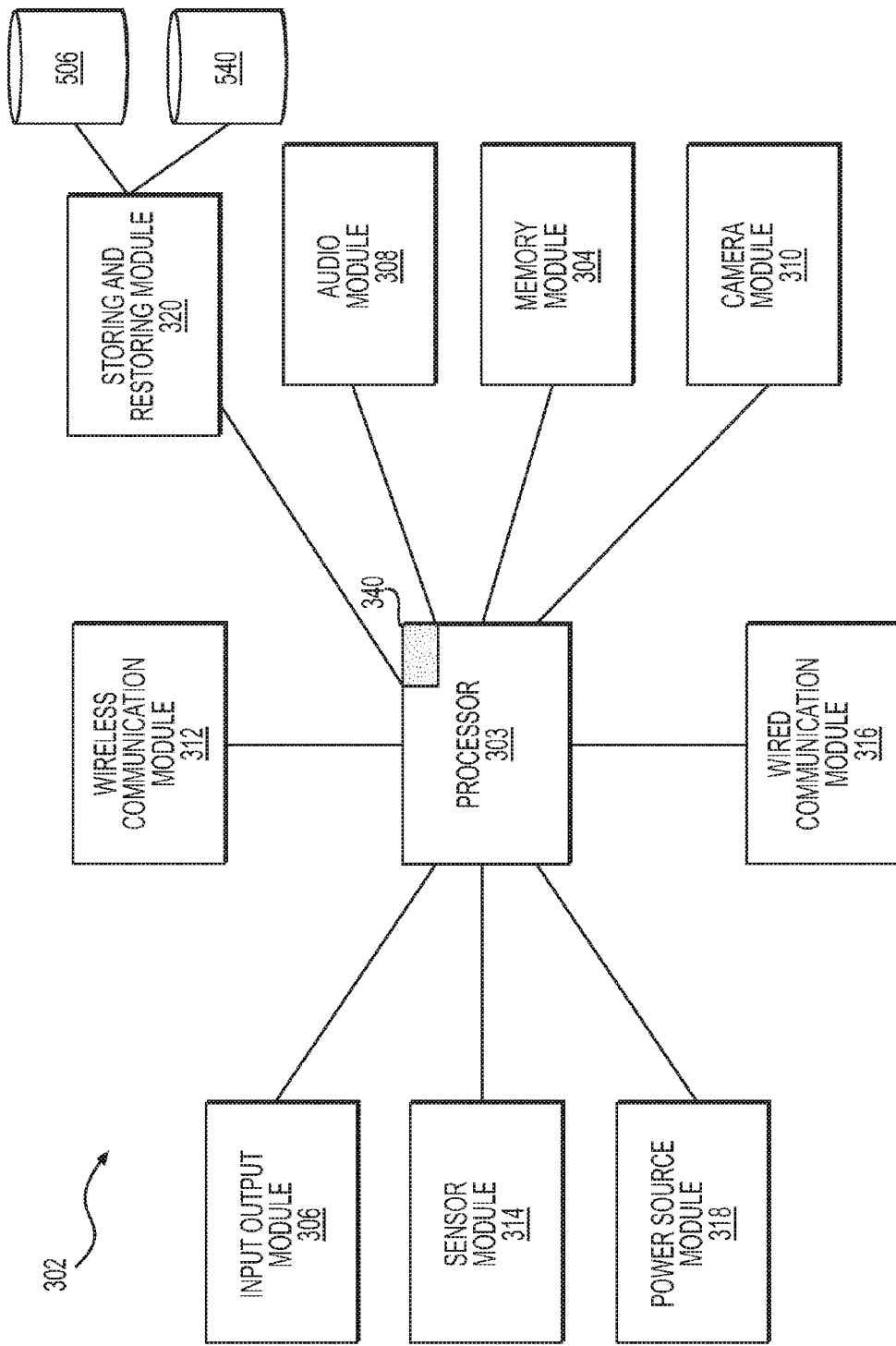
FIG. 3 depicts a diagram of an electronic device 302, the electronic device 302 being suitable for implementing embodiments of the present technology.

With reference to FIG. 3, there is depicted a diagram of an electronic device 302, the electronic device 302 being suitable for implementing embodiments of the present technology. The physical implementation of the electronic device 302 is not particularly limited, but as an example, the electronic device 302 may be implemented as a personal computer (desktops, laptops, netbooks, etc.), a wireless electronic device (a cell phone, a smartphone, a tablet and the like), as well as network equipment (a router, a switch, or a gateway).

The electronic device 302 comprises hardware and/or software and/or firmware (or a combination thereof), as is known in the art, to execute a browser application 340, the browser application 340 being implemented in accordance with non-limiting embodiments of the present technology.

The electronic device 302 may comprise a processor 303. In a particular embodiment, the processor 303 may comprise one or more processors and/or one or more microcontrollers configured to execute instructions and to carry out operations associated with the operation of the electronic device 302. In various embodiments, processor 303 may be implemented as a single-chip, multiple chips and/or other electrical components including one or more integrated circuits and printed circuit boards. Processor 303 may optionally contain a cache memory unit (not depicted) for temporary local storage of instructions, data, or computer addresses. By way of example, the processor 303 may include one or more processors or one or more controllers dedicated for certain processing tasks of the electronic device 302 or a single multi-functional processor or controller.

The processor 303 is operatively coupled to a memory module 304. Memory module 304 may encompass one or more storage media and generally provide a place to store computer code (e.g., software and/or firmware). By way of example, the memory module 304 may include various tangible computer-readable storage media including Read-Only Memory (ROM) and/or Random-Access Memory (RAM). As is well known in the art, ROM acts to transfer data and instructions uni-directionally to the processor 303, and RAM is used typically to transfer data and instructions in a bi-directional manner. Memory module 304 may also include one or more fixed storage devices in the form of, by way of example, hard disk drives (HDDs), solid-state drives (SSDs), flash-memory cards (e.g., Secured Digital or SD cards, embedded MultiMediaCard or eMMD cards), among other suitable forms of memory coupled bi-directionally to the processor 303. Information may also reside on one or more removable storage media loaded into or installed in the electronic device 302 when needed. By way of example, any of a number of suitable memory cards (e.g., SD cards) may be loaded into the electronic device 302 on a temporary or permanent basis.

Within embodiments of the present technology, the memory module 304 comprises a RAM portion and a fixed storage drive (SSD) portion. Naturally, within these embodiments of the present technology, the memory module 304 may be implemented as separate distinct structural components: one implementing the RAM portion and one implementing the fixed storage drive (SSD) portion.

The memory module 304 may store inter alia a series of computer-readable instructions, which instructions when executed cause the processor 303 (as well as other components of the electronic device 302) to execute the various operations described herein.

The electronic device 302 further comprises an input output module 306. Input output module 306 may comprise one or more input and output devices operably connected to processor 303. For example, input-output module 206 may include keyboard, mouse, one or more buttons, thumb wheel, and/or display (e.g., liquid crystal display (LCD), light emitting diode (LED), Interferometric modulator display (IMOD), or any other suitable display technology). Generally, input devices are configured to transfer data, commands and responses from the outside world into electronic device 302. The display is generally configured to display a graphical user interface (GUI) that provides an easy to use visual interface between a user of the electronic device 302 and the operating system or application(s) running on the electronic device 302. Generally, the GUI presents programs, files and operational options with graphical images. During operation, the user may select and activate various graphical images displayed on the display in order to initiate functions and tasks associated therewith. Input output module 306 may also include touch based devices such as touchpad and touch screen. A touchpad is an input device including a surface that detects touch-based inputs of users. Similarly, a touch screen is a display that detects the presence and location of user touch inputs. Input output module 306 may also include dual touch or multi-touch displays or touchpads that can identify the presence, location and movement of more than one touch inputs, such as two or three finger touches.

In the particular embodiment of the electronic device 302 being implemented as a smartphone, the input output module 306 can be implemented a touch-sensitive screen.

In particular embodiments, electronic device 302 may additionally comprise an audio module 308, a camera module 310, a wireless communication module 312, sensor modules 314, and/or wired communication module 316, all operably connected to the processor 303 to facilitate various functions of electronic device 302.

For example, the camera module 208, including an optical sensor (e.g., a charged coupled device (CCD), or a complementary metal-oxide semiconductor (CMOS) image sensor), can be utilized to facilitate camera functions, such as recording photographs and video clips. For example, the wired communication module 216 can include a Universal Serial Bus (USB) port for file transferring, or a Ethernet port for connection to a local area network (LAN). Additionally, electronic device 302 may be powered by a power source module 218, which can be executed as rechargeable batter or the like.

Wireless communication module 212 can be designed to operate over one or more wireless networks, for example, a wireless personal area network (WPAN) (such as, for example, a BLUETOOTH WPAN, an infrared PAN), a WI-FI network (such as, for example, an 802.11a/b/g/n WI-FI network, an 802.11s mesh network), a WI-MAX network, a cellular telephone network (such as, for example, a Global System for Mobile Communications (GSM) network, an Enhanced Data Rates for GSM Evolution (EDGE) network, a Universal Mobile Telecommunications System (UMTS) network, and/or a Long Term Evolution (LTE) network). Additionally, wireless communication module 212 may include hosting protocols such that electronic device 302 may be configured as a base station for other wireless devices.

Sensor module 314 may include one or more sensor devices to provide additional input and facilitate multiple functionalities of the electronic device 302.

In particular embodiments, various components of electronic device 302 may be operably connected together by one or more buses (including hardware and/or software). As an example and not by way of limitation, the one or more buses may include an Accelerated Graphics Port (AGP) or other graphics bus, an Enhanced Industry Standard Architecture (EISA) bus, a front-side bus (FSB), a HYPER-TRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCI-X) bus, a serial advanced technology attachment (SATA) bus, a Video Electronics Standards Association local (VLB) bus, a Universal Asynchronous Receiver/Transmitter (UART) interface, a Inter-Integrated Circuit ($I^2C$) bus, a Serial Peripheral Interface (SPI) bus, a Secure Digital (SD) memory interface, a MultiMediaCard (MMC) memory interface, a Memory Stick (MS) memory interface, a Secure Digital Input Output (SDIO) interface, a Multi-channel Buffered Serial Port (McBSP) bus, a Universal Serial Bus (USB) bus, a General Purpose Memory Controller (GPMC) bus, a SDRAM Controller (SDRC) bus, a General Purpose Input/Output (GPIO) bus, a Separate Video (S-Video) bus, a Display Serial Interface (DSI) bus, an Advanced Microcontroller Bus Architecture (AMBA) bus, or another suitable bus or a combination of two or more of these.

Figure 2:
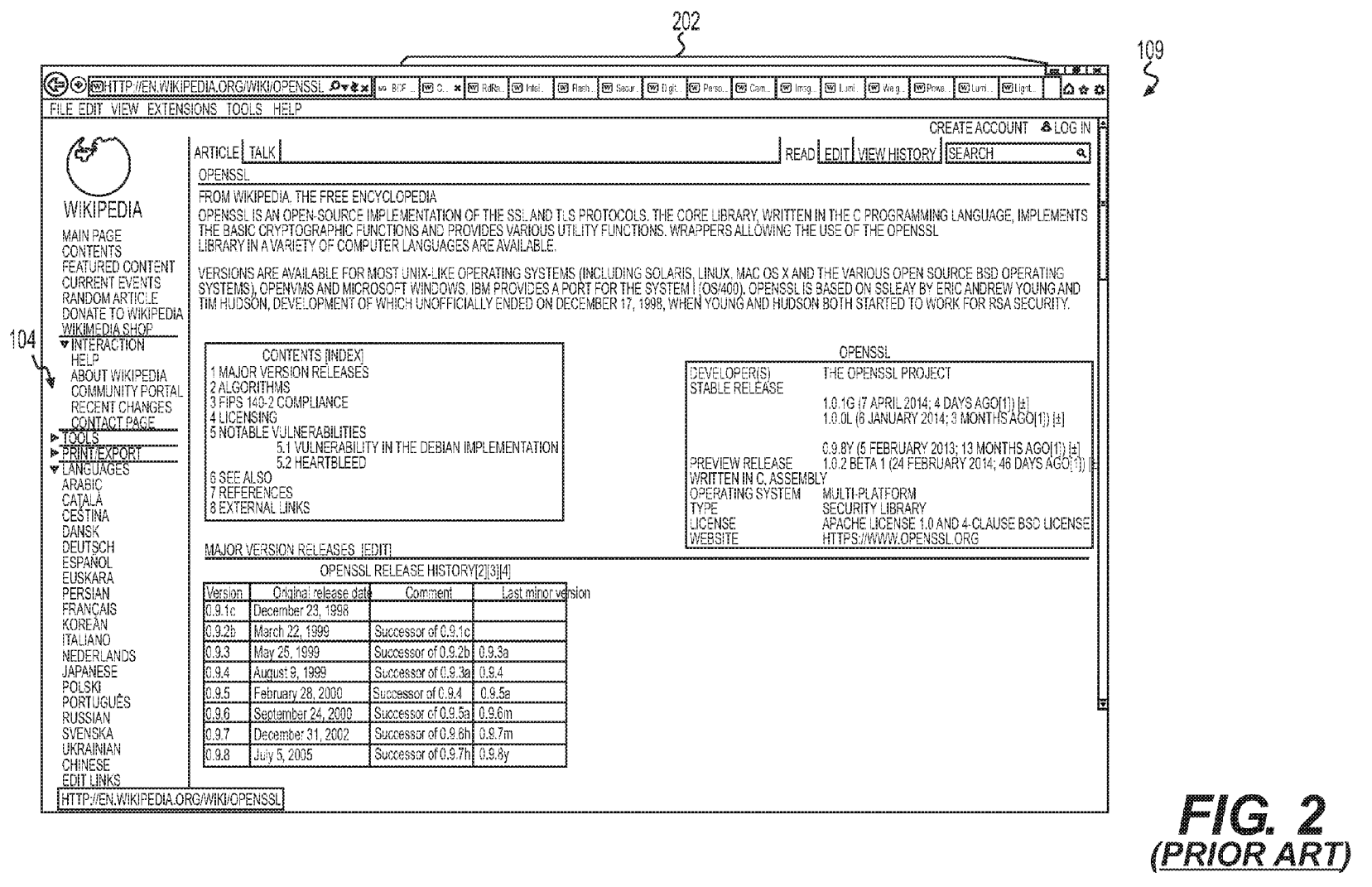

The processor 303 can execute (and the memory module 304 may store the computer-executable instructions for) a storing and restoring module 320. Broadly speaking, the purpose of the storing and restoring module 320 is to hibernate content of one or more tabs open in the browser application 340, similar to the fifteen instances of tabs 202 presented with reference to FIG. 2.

Figure 4:
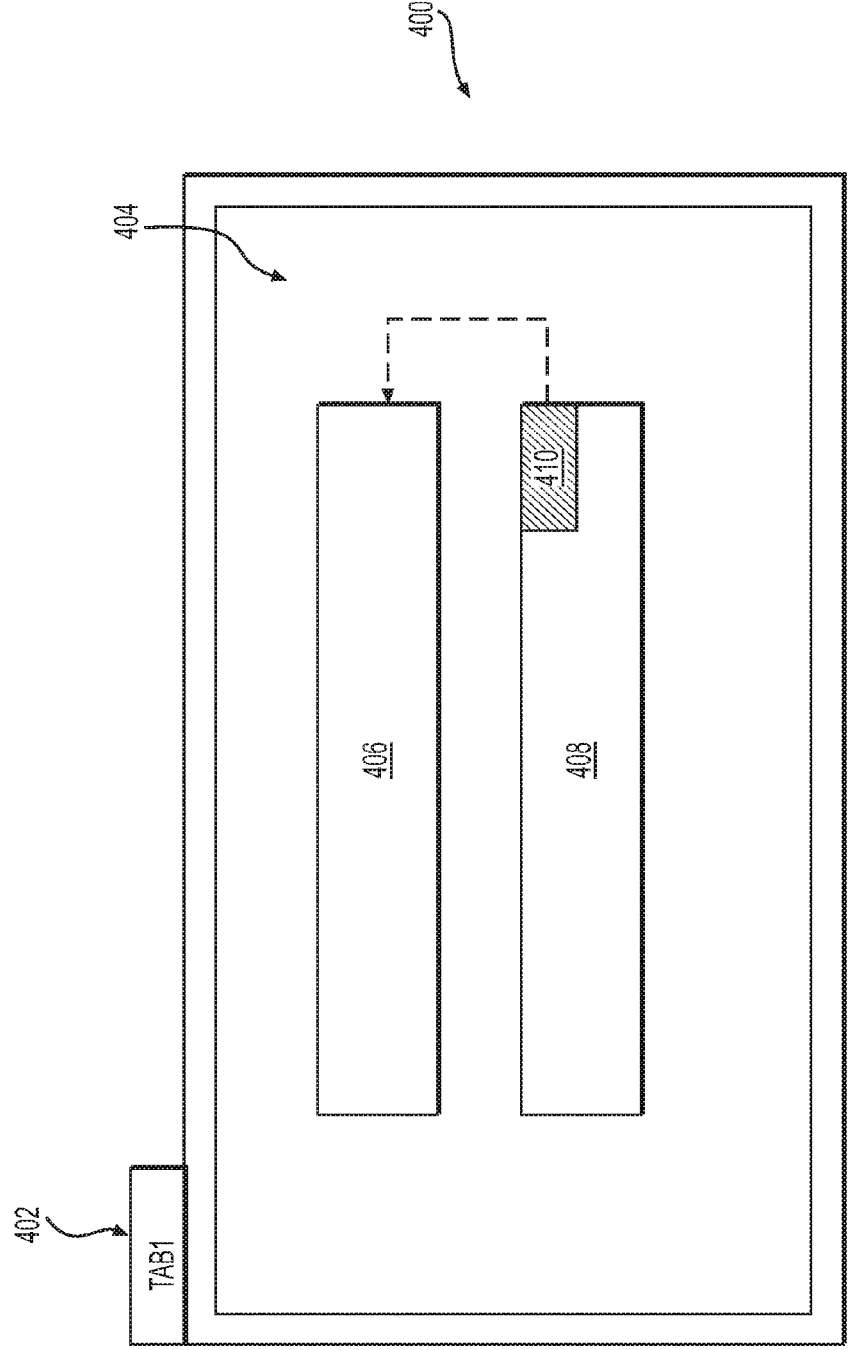
FIG. 4 depicts a screen shot 400, the screen shot 400 being a portion of the display of an output of the browser application 340 showing a web page 404.

In order to illustrate embodiments of the present technology, reference will be made to FIG. 4, which depicts a screen shot 400, the screen shot 400 being a portion of the display of an output of the browser application 340. The screen shot 400 depicts an illustrative content of a web page 404 displayed in a tab 402, the tab being one of plurality of tabs potentially being displayed within the browser application 340 (much akin to the fifteen instances of tabs 202 presented with reference to FIG. 2).

Within embodiments of the present technology, the web page 404 can be encoded in Hyper Text Markup Language (HTML), which is known to those skilled in the art of creating content of web pages 404. However, it should be expressly understood that the teachings presented herein are not limited to web pages 404 encoded in HTML.

The web page 404 can contain a plurality of elements—such as a static object 406 and a dynamic object 408. In an embodiment of the present technology, the static object 406 can contain an HTML encoded object and the dynamic object 408 can contain a JavaScript encoded object. The HTML object can be pre-populated by a web master (not depicted) of the web page 404. For example, a given HTML can take form of <div><sample text> for displaying an HTML object having the text <sample text>.

The JavaScript encoded object can make calls to one or more of the HTML objects. For example, the JavaScript object can be a button (or any other JavaScript based object for that matter), which changes font and/or color of the HTML object upon user pressing the button, as an example only. In other words, the dynamic object 408 can change itself or change other elements of the web page 404 based on an action of the user visiting the web page 404. This link between the dynamic object 408 and the static object 406 of the web page 404 is schematically represented as a binding 410 within the illustration of FIG. 4. For the avoidance of doubt, the binding 410 is a form of a link between the JavaScript code (being an example of the dynamic object 408) and the called-upon HTML code (being an example of the static object 406) or vice versa.

For illustration purposes, it shall be assumed that the web page 404 is rendered using the HTML code illustrated in Table 1 of FIG. 7.

In accordance with embodiments of the present technology, it may be desirable to store the content of the web page 404 for it to be restored at a later point in time. For example, it may be desirable to store the content of the web page 404 as part of a tab hibernation routine, such as hibernating the content of the tab 402 (as well as any other tabs potentially opened within the browser application 430) and then restore the content of the tab 402 (as well as any other tabs potentially opened within the browser application 430) as part of the tab restoration routine.

The tab hibernation routine can be implemented for a given tab 402 after a pre-determined period of user inactivity within the given tab 402. For example, the tab hibernation routine can be initiated for the given tab 402 after 5 minutes of user inactivity, 10 minutes of user inactivity, 90 minutes of user inactivity and the like. In some embodiments, the pre-defined period of user inactivity is set by the user, in others, by the browser application 340.

Within embodiments of the present technology, user inactivity denotes a situation where the user is not active in the given tab 402 (i.e. no clicking, no scrolling or the like) and/or when a different one of the tabs 402 is active (or a different application from the browser application 340). However, how the user inactivity is determined and/or how the hibernation routine is triggered is not limited and may take may alternative forms in the alternative embodiments of the present technology.

In alternative embodiments, the tab hibernation routine can be executed on demand, upon receipt of user indication of the user-desire to execute the tab hibernation routine.

Within embodiments of the present technology, ability to execute tab hibernation routine (and, more specifically, ability to store the content of the tab 402 and accurately restore the content of the tab 402) allows to save memory resources (such as random-access memory (RAM) or the like) by saving the content of the hibernated tab into a portion of memory on the hard drive (such as a solid state drive (SSD) or the like). In other words, when it is determined that the content of the given tab 402 is not used by the user, the content thereof can be moved from RAM to SSD.

When the user activates the content of the given tab 402, the embodiments of the present technology allow for restoration of the content, including dynamic components thereof by transferring the content of the given tab 402 from SSD back to RAM.

As an illustration the static object 406 can be implemented as an HTMLDivElement object and a CSSStyleDeclaration class associated with the HTMLDivElement object (as illustration sonly). According to the embodiments of the present technology, the HTMLDivElement object and the CSSStyleDeclaration class may have been pre-populated by the web master associated with the web page 404.

The dynamic object 408 can be implemented as a JavaScript object (or JS scrip for short). As has been alluded to above, the JS script can be for executing a particular action upon occurrence of a pre-determined event. To the extent that the JS script involves an action with the HTML object, there is created the binding 410 between the JS script and the HTML objects. Within the illustrated embodiment, a portion of the JS script can point to (or "link to" or "bind to", as is also known in the art) either one or both of the HTMLDivElement object and the CSSStyleDeclaration class.

Generally speaking, in order to hibernate and then restore the content of the web page 404, the storing and restoring module 320 can be configured to (i) store and then retrieve the static object 406, (ii) store and then retrieve the dynamic object 408, and (iii) store and then retrieve a binding (or a plurality of bindings, as the case may be) between the dynamic object 408 and the static object 406 (or vice versa).

More specifically, in order to hibernate and then restore the content of the web page 404, the storing and restoring module 320 can be configured to (i) store and then retrieve the static object 406 as part of a DOM tree, (ii) store and then retrieve serialized JavaScript heap containing the dynamic object 408, and (iii) store and retrieve a binding between the dynamic object 408 and the static object 406 (or vice versa), as will be described below.

The processes for storing (and then retrieving) the static object 406 can be implemented as storing the static object 406 into the DOM tree structure and the dynamic object 408 into the JavaScript heap. These storing and restoring techniques are generally known in the art and any suitable known approach can be used.

For example, Document Object Model (DOM) is known to be a cross-platform and language-independent convention for representing and interacting with objects in various languages, such as but not limited to: HTML, XHTML and XML documents. Generally speaking, according to the DOM approach, the nodes of every document are organized in a tree structure, called the DOM tree. Objects in the DOM tree may be addressed and manipulated by using methods on the objects. The public interface of a DOM is specified in its application programming interface (API).

Within some embodiments of the present technology, the storing and restoring module 320 is configured to store at least some of the DOM tree objects (such as the static object 406) using MIME HTML (MHTML) format.

The storing and restoring module 320 is further configured to serialize the Java Scrip heap using the known V8 JavaScript engine, provide by GOOGLE of Googleplex, Mountain View, Calif., United States of America.

According to embodiments of the present technology, the storing and restoring module 320 is further configured to store and then retrieve bindings between the JavaScript heap and the DOM tree, as will be explained in greater detail herein below. Within embodiments of the present technology, the storing and restoring module 320 is configured to use MHTML archive to store the DOM tree objects, the serialized JavaScript heap and the bindings between the DOM tree objects and the JavaScript heap.

Within embodiments of the present technology, the bindings between the DOM tree objects and the JavaScript heap are used to properly restore the content of the web page 404. This is particularly useful, but is not limited to, those embodiments where the JavaScript content is dynamic and is updated from time to time. Ability to store the bindings between the DOM objects and the JavaScript heap allows to store and retrieve the content of the web page 404 (as part of the tab hibernation routine, for example) taking into account dynamic updates to the HTML objects and/or JavaScript objects carried out prior to hibernation. Using the above referenced example of a JavaScript button for changing font/color of an HTML object, the embodiments of the present technology allow for preserving this dynamic state of changed font/color as part of storing/restoring (or broadly speaking, as part of the tab hibernation routine).

Figure 5:
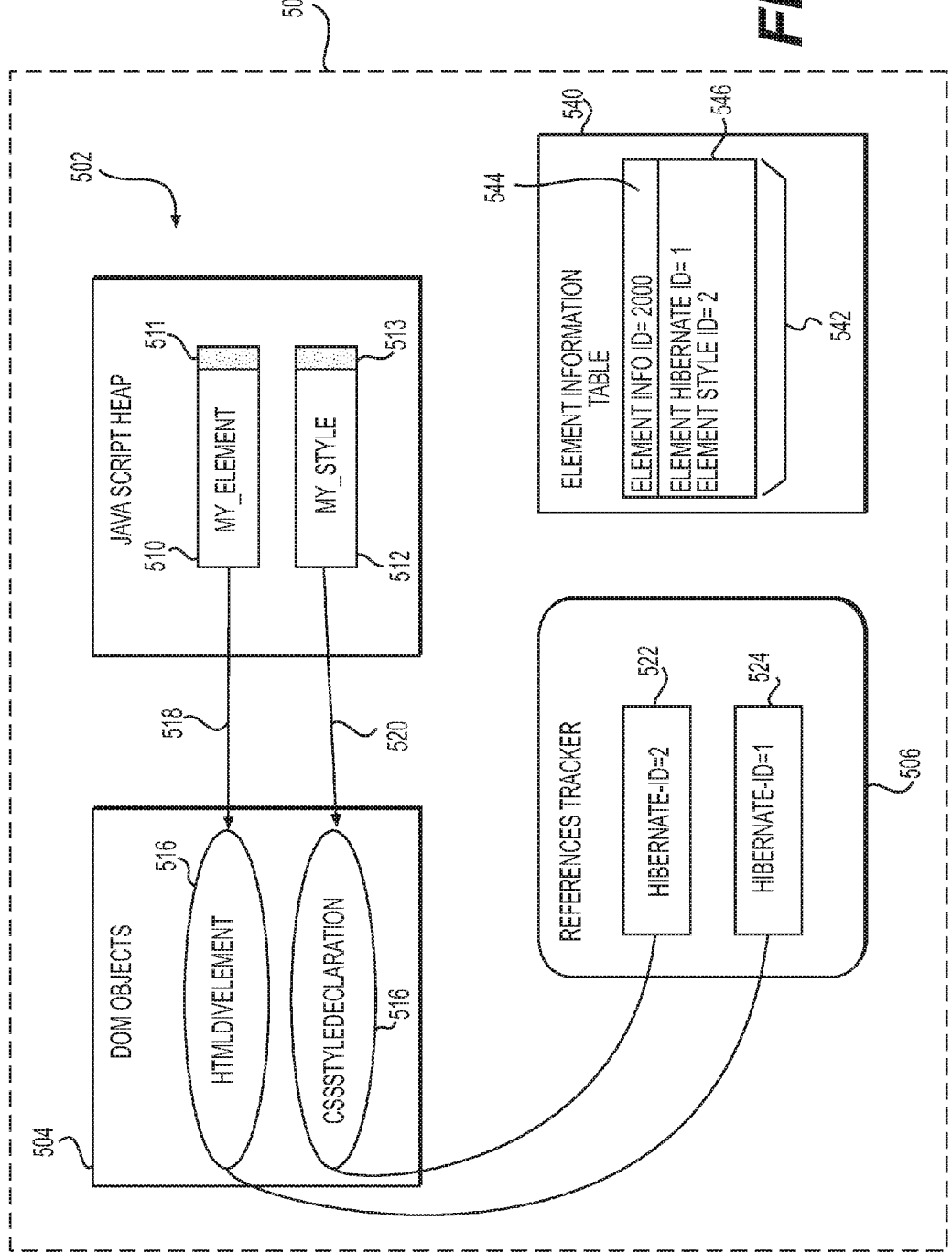
FIG. 5 depicts a schematic representation of the content of an archive file 500.

With reference to FIG. 5, there is depicted an example of an archive file 500. The example archive file 500 can be an MHTML archive file. Naturally, any other format or protocol for implementing the archive file 500 can be used.

The archive file 500 comprises a Java Script heap 502, a DOM objects tree 504, a reference tracker 506 and an element information table 540. The Java Script heap 502 contains a first JS object 510 (illustrated as my_element) and a second JS object 512 (illustrated as my_style). The DOM object tree 504 contains a first DOM tree object 514 (illustrated as HTMLDivElement) and a second DOM tree object 516 (illustrated as CSSStyleDeclaration).

How these elements of the archive file 500 are populated and used during the tab hibernation routine will now be explained.

Broadly speaking, the storing and restoring module 320 is configured to store within the DOM objects tree 504, HTML objects corresponding to the HTML tags of the HTML code for rendering the web page 404—this is the example of the first DOM tree object 514. Any additional objects present within the web page 404 (such as CSS or images) are also saved in the archive file 500 as additional static objects— this is the example of the second DOM tree object 516.

According to embodiments of the present technology, the storing and restoring module 320 is also configured to add a serialized JavaScrip heap to the archive file 500—this is depicted as the JavaScript heap 502. In addition, the information management module 130 is also configured to store, as part of the archive file 500, the reference tracker 506 and the element information table 540 containing binding 410 data for storing and subsequent restoring of bindings between the JavaScript objects and the DOM tree objects.

How the information for the reference tracker 506 and the element information table 540 is populated and used will now be described.

During the rendering of the web page 404 from the associated HTML code, when a given binding 410 is created for a given web page 404, the storing and restoring module 320 creates a record in the reference tracker 506. The record in the reference tracker 506 maps a unique identifier (assigned by the storing and restoring module 320) of the static object 406 (referred to as "hibernate ID" herein below) with the associated indication of the binding 410 of the dynamic object 408.

Later on, when storing the JavaScript heap 502, when the storing and restoring module 320 locates a given binding 410 pointing to a given static object 406, the storing and restoring module 320 accesses the reference tracker 506 to determine the associated hibernate-id of the given static object 406 to which the given binding 410 points and stores the indication of the hibernate-ID in the associated record in the JavaScript heap 502—as part of the record for the associated dynamic object 408—as a record 511 in association with the first JS object 510 and as a record 513 in association with the second JC object 512.

Those skilled in the art will appreciate that not all DOM objects that can be potentially linked by the JavaScript heap are associated with HTML tags. For example, a given HTML element can have an associated field, such as a style field, which describes the style of the element. As another example, the given HTML element may have an associated child field, pointing to one or more of children elements. JavaScript objects can have bindings to any one of the HTML object itself, the associated field or any of its children fields.

Therefore, the storing and restoring module 320 can maintain the element information table 540, which maintains a mapping between a given one of HTML objects (and its associated or children fields/objects) and a given hibernate-ID of the HTML objects (as well as respective hibernate-IDs of its associated or children fields/objects).

The storing and restoring module 320 is configured to add, to the HTML code associated with each of the HTML objects, an additional attribute called "hibernate-info-id", which points to a particular entry in the element information table 540 (by means of a unique identifier associated therewith).

The above process will be illustrated using the above referenced HTML code outlined in Table 1 above for rendering the web page 404.

Step A

When the web page 404 is loaded into the browser application 340, the browser application 340 creates the static object 406, based on HTML tags and any associated dependent objects (associated or children), within this illustration using HTMLDivElement and CSSStyle Declaration objects.

Step B

The browser application 340 then creates the dynamic object 408.

More specifically, when executing lines 9 and 10 of the above sample HTML (see Table 1), the browser application 340 creates a binding 410 to the HTML objects from the JavaScript.

When the given binding 410 is created it is registered in the reference tracker 506, as has been described above. In other words, the storing and restoring module 320 creates the hibernate-ID associated with the HTML objects for each of the bindings 410 and stores an indication thereof in the reference tracker 506.

When a first binding 518 between the first JS object 510 and the first DOM tree object 514 is created, a first record 524 is made in the reference tracker 506 (illustrated as "hibernate-id=1"). When a second binding 520 between the second JS object 512 and the second DOM tree object 516 is created, a second record 522 is made in the reference tracker 506 (illustrated as "hibernate-id=2").

Step C

When the JavaScript heap 502 is saved, the storing and restoring module 320 saves hibernate-ID, in lieu of the actual indications of bindings 410 to the HTML objects. More specifically, the storing and restoring module 320 saves "hibernate-id=2" as part of the record 511 in association with the first JS element 510 and "hibernate-id=1" as part of the record 513 in association with the second JS element 512

Step D

The storing and restoring module 320 then creates a record 546 in the element information table 540. The record 540 contains a unique element identifier 544 (containing a unique identifier of the record associated with a particular static object 406—in this case one of the first DOM tree object 514 and the second DOM tree object 516) and an element content 542 (containing description of the associated DOM tree object in terms of its hibernate-ID and/or hibernate-IDs of associated objects).

In the depicted embodiment, the unique element identifier 544 is illustrated as "Element info id=2000" and the element content 542 is illustrated as "element hibernate id=1" and "element style id=542".

Step E

The storing and restoring module 320 then saves DOM tree 504 objects in the form of their HTML. When the storing and restoring module 320 reaches the HTMLDivElement object (as an example), the storing and restoring module 320 determines that there exists an entry in the element information table 540 associated with the HTMLDivElement object. The storing and restoring module 320 then add the "hibernate-info-id" to the archive 500 record associated with the record HTMLDivElement object, the "hibernate-info-id" containing the identifier from the element information table 540.

An example record can look like this:

<div•id="test-div"•style="color:red"•hibernate-info-id="2000"|>Something</div>

As a result of the above, the archive file 500 maintains the MHTML archive content illustrated in Table 2 of FIG. 7.

The web site 404 content saving routine then terminates. It is noted that in some embodiments, the content of the reference tracker 506 is not saved as part of the hibernation routine (i.e. only the content of the element reference table 540).

At a later stage, when it is desirable to restore the content of the web page 404, a content restoration routine is executed. The content restoration routine can be executed when the user makes the associated tab 402 active, for example, by clicking on it or otherwise actuating it into the active state.

Step A

The storing and restoring module 320 access the archive file 500 and retrieves HTML tags and restores DOM tree 504 objects based on the information contained in the DOM tree 504 objects.

Step B

Each of the DOM tree 504 object is checked for an associated "hibernate-info-id" attribute, such as in the example above:

<div•id="test-div"•style="color:red"•hibernate-info-id="2000"|>Something</div>

Step C

The storing and restoring module 320 then accesses the element information table 540. Based on the "hibernate-info-id" (which contains a unique identifier of the record 546), the associated record from the element information table 540 is retrieved. The storing and restoring module 320 then retrieves the associated hibernate-id of the HTML object (as well as any of its associated objects).

Step D

The storing and restoring module 320 then re-registers the hibernate-ID of the HTML object and any of the associated objects in the reference tracker 506.

Step E

The storing and restoring module 320 then deletes the "hibernate-info-id" from the HTML code:

<div•id="test-div"•style="color:red"•hibernate-info-id="2000"|>Something</div>.

Step F

The storing and restoring module 320 then restores the JavaScript heap 502. If during the restoration of the JavaScript heap a binding 410 is identified, the storing and restoring module 320 makes a request to the reference tracker 506 and the reference tracker 506 provides, based on the hibernate-ID stored in the record 511 or the record 513, an identifier of the associated DOM tree 504 object. The storing and restoring module 320 then restores the binding 410 between the dynamic object 408 and the static object 406 based on the identifier received from the reference tracker 506.

It should be noted that the element information table 540 may contain additional data than what has been described above (i.e. additional to hibernate-id). For example, the element information table may maintain information representative of the listener events.

For example, many of the DOM elements can call upon a JavaScript function, which will be triggered upon occurrence of a pre-determined event associated with the DOM object (such as a user clicking onto the text associated with the DOM element and the like). During serialization of the JavaScript of the web page 404, the storing and restoring module 320 identifies all such registered functions and maintains this information in the element information table 540 pointing which DOM element is associated with which event listener.

The given record of the element information table 540 maps: (i) hibernate-id of such the DOM element; (ii) identity of the event; (iii) and a pointer to the JC function which needs to be called. The pointer to the function can be implemented as a space number in the JavaScript heap 502 and a displacement of the function from the space number.

Given the architecture described above, it is possible to execute a method of storing content of the web page 404, web page 404 having the static object 406 and the dynamic object 408. The web page 404 is being displayed in the browser application 340 executed on the electronic device 102, the electronic device 102 having a memory (i.e. the memory module 304). It is noted that in some embodiments, prior to execution of the method, the content of the web page 404 (i.e. the static object 406 and the dynamic object 408) is stored in the random-access memory (RAM) portion thereof.

Figure 6:
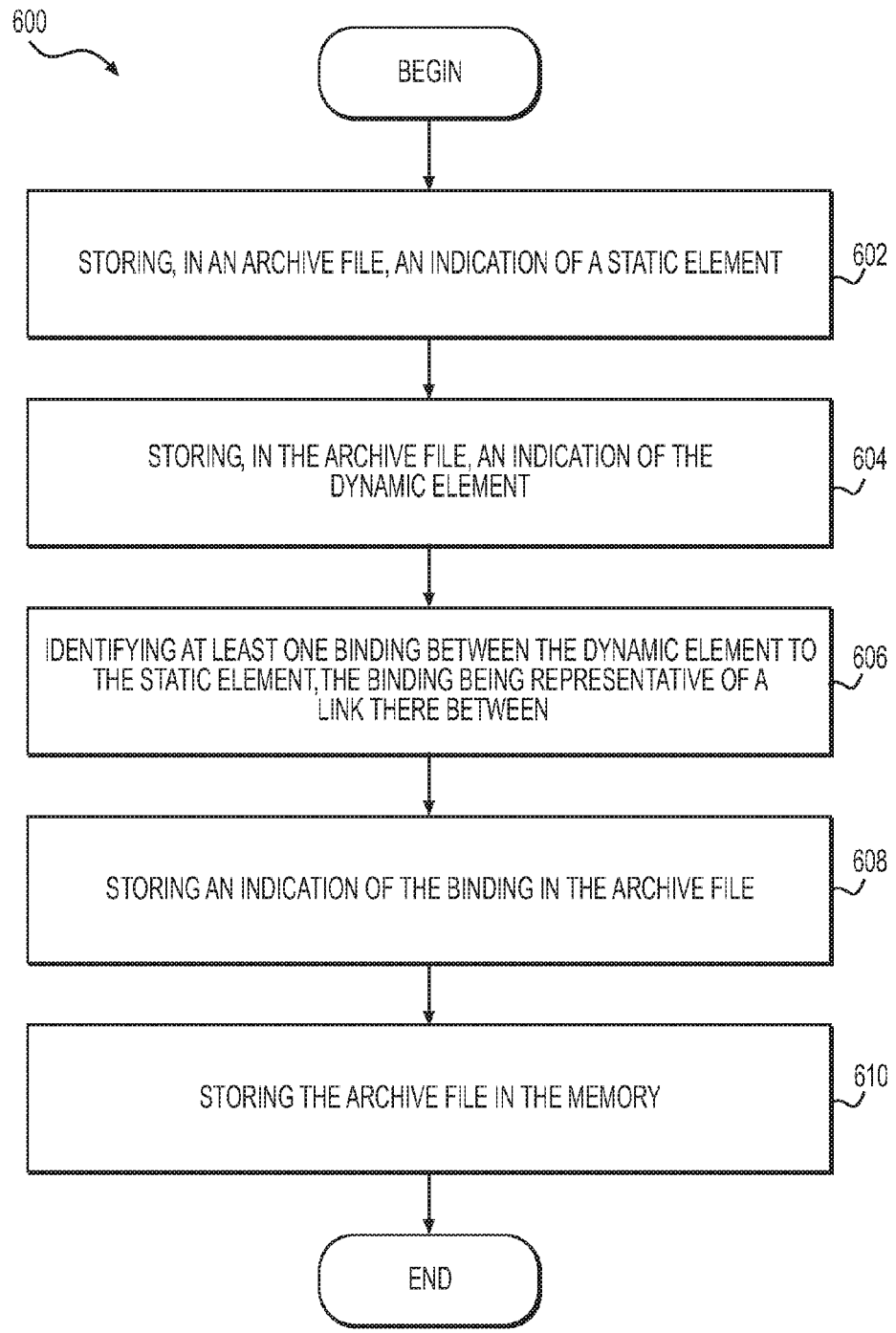
FIG. 6 depicts a block diagram of a method 600, the method 600 being executed in accordance with non-limiting embodiments of the present technology.

The method is executed by the electronic device 102. With reference to FIG. 6 there is depicted a block diagram of a method 600, the method 600 being executed in accordance with non-limiting embodiments of the present technology.

Step 602—Storing, in an Archive File, an Indication of the Static Object

The method 600 begins at step 602, where the storing and restoring module 320 stores, in an archive file, an indication of the static object 406.

In some embodiments of the method 600, the archive file can be implemented as an MHTML file.

In some embodiments of the method 600, the step of storing the indication of the static object comprises storing a DOM tree element in the MHTML file.

Step 604—Storing, in the Archive File, an Indication of the Dynamic Object

Next, at step 604, the storing and restoring module 320 stores in the archive file, an indication of the dynamic object 408.

In some embodiments of the method 600, the step of storing the indication of the dynamic object 406 comprises serializing a JavaScrip heap 502 and storing an indication thereof in the MHTML file.

Step 606—Identifying at Least One Binding Between the Dynamic Object to the Static Object, the Binding being Representative of a Link Therebetween Next, at step 606, the storing and restoring module 320 identifies at least one binding 410 between the dynamic object 406 to the static object 408, the binding being representative of a link therebetween. It should be expressly understood that the reference to the binding 410 between the dynamic object 406 to the static object 408 includes the reversed direction of the binding 410 from the static object 408 to the dynamic object 406.

Step 608—Storing an Indication of the Binding in the Archive File

At step 608, the storing and restoring module 320 stores an indication of the binding 410 in the archive file 500.

In some embodiments of the method 600, the step of storing an indication of the binding comprises maintaining the reference tracker 506 for mapping the static object 406 to an associated hibernate-ID, the hibernate-ID being representative of the binding.

In some embodiments of the method 600, the step of storing an indication of the binding further comprises maintaining an element information table 540 mapping an identifier of the static object 406 and the associated hibernate-id, the mapping having a unique record identifier.

In some embodiments of the method 600, the static object 408 can comprise an associated object. Within these embodiments, the dynamic object 408 may include a respective binding to the static object 406 and the associated object, and as such the element information mapping can maintain a respective hibernate-ID identifier for the static object 406 and the associated object in association with the unique record identifier.

The method 600 further comprises augmenting a record associated with the DOM tree element in the MHTML file with an indication of the unique record identifier and augmenting a record associated with the dynamic object 406 in the JavaScrip heap with an indication of the hibernate-ID of the static object 408.

Step 610—Storing the Archive File in the Memory

At step 610, the storing and restoring module 310 stores the archive file 500 in the memory (i.e. in the memory module 304).

In some embodiments of the method 600, the storing and restoring module 320 stores the archive file in the hard drive portion of the memory. As such, it can be said, that the memory can comprise a random access memory portion and a hard drive memory portion, prior to execution of the method 600, the static object 406 and the dynamic object 408 can be stored in the random access memory portion and in the hard drive memory after execution of the method 600.

The method 600 further comprises restoring the archive file 500. The restoring of the archive file 500 can be executed at a later point of time, as part of the tab restoration routine. The restoring of the archive file 500 can be executed by means of executing the following steps: (a) retrieving the static object 406 from the DOM tree element in the MHTML file; retrieving the dynamic object 408 from the JavaScrip heap stored in the MHTML file; retrieving the binding 410 from the MHTML file.

In some embodiments of the method 600, the step of retrieving the binding from the MHTML file can be executed by means of: responsive to the record associated with the DOM tree element in the MHTML file containing the indication of the unique record identifier, accessing the element information table 540 to retrieve the associated hibernate-id; re-registering said hibernate-ID and the associated object identifier in the reference tracker 506; responsive to detection of the indication of the hibernate-ID in the record associated with the dynamic object 408 in the JavaScript heap 502, accessing the reference tracker 506 to retrieve the associated object identifier; based on the associated object identifier, restoring the binding 410.

Even though the above description has provided MHTML archive as an example of implementation for the embodiments of the present technology, they are not necessarily so limited. Any other commercially available or proprietary protocol can be used, such as a binary format and the like.

One skilled in the art will appreciate when the instant description refers to "receiving data" from a user that the electronic device executing receiving of the data from the user may receive an electronic (or other) signal from the user. One skilled in the art will further appreciate that displaying data to the user via a user-graphical interface (such as the screen of the electronic device and the like) may involve transmitting a signal to the user-graphical interface, the signal containing data, which data can be manipulated and at least a portion of the data can be displayed to the user using the user-graphical interface.

Some of these steps and signal sending-receiving are well known in the art and, as such, have been omitted in certain portions of this description for the sake of simplicity. The signals can be sent-received using optical means (such as an optical connection), electronic means (such as using wired or wireless connection), and mechanical means (such as pressure-based, temperature based or any other suitable physical parameter based).

It should be expressly understood that not all technical effects mentioned herein need to be enjoyed in each and every embodiment of the present technology. For example, embodiments of the present technology may be implemented without the user enjoying some of these technical effects, while other embodiments may be implemented with the user enjoying other technical effects or none at all.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

The invention claimed is:

1. A method of storing content of a web page, the web page having a static object and a dynamic object, the web page being displayed in a browser application executed on an electronic device, the electronic device having a memory, the method being executed by the electronic device, the method comprising:

storing, in an archive file, an indication of the static object;

storing, in the archive file, an indication of the dynamic object;

identifying at least one binding between the dynamic object to the static object, the binding being representative of a link therebetween;

storing an indication of the binding in the archive file; and
storing the archive file in the memory; and wherein:
said archive file comprises an MHTML file;
said storing an indication of the binding comprises maintaining a reference tracker, the reference tracker for mapping the static object to an associated hibernate-ID, the hibernate-ID being representative of the binding;
said storing an indication of the binding further comprises maintaining an element information table mapping an identifier of the static object and the associated hibernate-id, the mapping having a unique record identifier;
said static object comprises an associated object, and wherein the dynamic object comprises a respective binding to the static object and the associated object, and wherein the element information mapping maintains a respective hibernate-ID identifier for the static object and the associated object in association with the unique record identifier; and
said storing the indication of the static object comprises storing a DOM tree element in the MHTML file, the method further comprising augmenting a record associated with the DOM tree element in the MHTML file with an indication of the unique record identifier.

2. The method of claim 1, further comprising augmenting a record associated with the dynamic object in the JavaScript heap with an indication of the hibernate-ID of the static object.

3. A method of storing content of a web page, the web page having a static object and a dynamic object, the web page being displayed in a browser application executed on an electronic device, the electronic device having a memory, the method being executed by the electronic device, the method comprising:
storing, in an archive file, an indication of the static object;
storing, in the archive file, an indication of the dynamic object;
identifying at least one binding between the dynamic object to the static object, the binding being representative of a link therebetween;
storing an indication of the binding in the archive file;
storing the archive file in the memory; and wherein:
said archive file comprises an MHTML file;
said storing the indication of the static object comprises storing a DOM tree element in the MHTML file;
said storing the indication of the dynamic object comprises serializing a JavaScript heap and storing an indication thereof in the MHTML file; and
said storing the indication of the binding comprises:
maintaining a reference tracker, mapping the static object to an associated hibernate-ID and maintaining an element information table mapping an identifier of the static object and the associated hibernate-id, the mapping having a unique record identifier;
augmenting a record associated with the DOM tree element in the MHTML file with an indication of the unique record identifier; and
augmenting a record associated with the dynamic object in the JavaScript heap with an indication of the hibernate-ID of the static object.

4. The method of claim 3, wherein said static object comprises an associated object, and wherein the dynamic object comprises a respective binding to the static object and the associated object, and wherein the element information mapping maintains a respective hibernate-ID identifier for the static object and the associated object in association with the unique record identifier.

5. The method of claim 3, further comprising restoring the archive file.

6. The method of claim 5, wherein said restoring comprises:
retrieving the static object from the DOM tree element in the MHTML file;
retrieving the dynamic object from the JavaScript heap stored in the MHTML file;
retrieving the binding from the MHTML file.

7. The method of claim 6, wherein said retrieving the binding from the MHTML file comprises:
responsive to the record associated with the DOM tree element in the MHTML file containing the indication of the unique record identifier, accessing the element information table to retrieve the associated hibernate-id;
re-registering said hibernate-ID and an associated object identifier in the reference tracker;
responsive to detection of the indication of the hibernate-ID in the record associated with the dynamic object in the JavaScript heap, accessing the reference tracker to retrieve the associated object identifier;
based on the associated object identifier, restoring the binding.

8. The method of claim 1, wherein said method is executed as part of tab hibernating routine, the hibernation routine being associated with a tab in the browser application associated with the web page.

9. The method of claim 8, wherein said tab hibernating routine is executed in response to detection of user inactivity in association with the tab.

10. The method of claim 8, further comprising executing a restoration routine.

11. The method of claim 10, wherein said restoration routine is executed in response to a user re-activating the tab.

12. The method of claim 1, wherein said memory comprises a random access memory and a hard drive memory, and wherein the static object and the dynamic object are stored in the random access memory prior to the execution of the method and in the hard drive memory after execution of the method.

13. A server comprising:
a communication interface for communication with an electronic device via a communication network;
a memory; and
a processor operationally connected with the communication interface and the memory, the processor configured to store content of a web page, the web page having a static object and a dynamic object, the web page being displayed in a browser application executed by the processor, the processor being further configured to:
store, in an archive file, an indication of the static object;
store, in the archive file, an indication of the dynamic object;
identify at least one binding between the dynamic object to the static object, the binding being representative of a link therebetween;
store an indication of the binding in the archive file;
store the archive file in the memory; and wherein:
said archive file comprises an MHTML file;
said storing an indication of the binding comprises maintaining a reference tracker, the reference tracker for mapping the static object to an associated hibernate-ID, the hibernate-ID being representative of the binding;

said storing an indication of the binding further comprises maintaining an element information table mapping an identifier of the static object and the associated hibernate-id, the mapping having a unique record identifier;

said static object comprises an associated object, and wherein the dynamic object comprises a respective binding to the static object and the associated object, and wherein the element information mapping maintains a respective hibernate-ID identifier for the static object and the associated object in association with the unique record identifier; and said storing the indication of the static object comprises storing a DOM tree element in the MHTML file, the method further comprising augmenting a record associated with the DOM tree element in the MHTML file with an indication of the unique record identifier.

* * * * *